United States Patent
Kim et al.

(10) Patent No.: US 11,953,417 B2
(45) Date of Patent: Apr. 9, 2024

(54) OSCILLATOR APPARATUS

(71) Applicant: Nokia Technologies Oy, Espoo (FI)

(72) Inventors: John D. Kim, Bridgewater, NJ (US);
Flavio Pardo, Glen Gardner, NJ (US);
Sina Moradian, Orlando, FL (US)

(73) Assignee: Nokia Technologies Oy, Espoo (FI)

( * ) Notice: Subject to any disclaimer, the term of this patent is extended or adjusted under 35 U.S.C. 154(b) by 429 days.

(21) Appl. No.: 17/487,256

(22) Filed: Sep. 28, 2021

(65) Prior Publication Data

US 2022/0099549 A1 Mar. 31, 2022

(30) Foreign Application Priority Data

Sep. 30, 2020 (EP) .................................. 20199377

(51) Int. Cl.
*G01N 15/06* (2006.01)
*H03B 5/32* (2006.01)
*H10N 30/87* (2023.01)

(52) U.S. Cl.
CPC ........... *G01N 15/0637* (2013.01); *H03B 5/32* (2013.01); *H10N 30/87* (2023.02)

(58) Field of Classification Search
CPC ........... G01N 15/0637; G01N 29/4481; G01N 2291/0255; G01N 2291/0256; G01N 2291/106; G01N 29/036; G01N 29/2443; G01N 29/022; H03B 5/32; H10N 30/87
See application file for complete search history.

(56) References Cited

U.S. PATENT DOCUMENTS

| | | |
|---|---|---|
| 8,513,864 B2 | 8/2013 | Ho |
| 8,624,471 B1 | 1/2014 | Ayazi et al. |
| 8,669,823 B1 * | 3/2014 | Olsson ............... H03H 9/02102 331/158 |
| 10,749,539 B2 * | 8/2020 | Kriz ........................ H03L 7/26 |
| 2004/0207492 A1 * | 10/2004 | Nguyen ............... H03H 9/2436 333/199 |
| 2004/0244487 A1 | 12/2004 | Kolosov et al. |
| 2008/0100176 A1 * | 5/2008 | Haskell ............... H10N 30/302 73/579 |
| 2011/0228809 A1 | 9/2011 | Tadigadapa |
| 2012/0081195 A1 | 4/2012 | Adam et al. |

(Continued)

FOREIGN PATENT DOCUMENTS

| | | | |
|---|---|---|---|
| EP | 1058109 A1 * | 12/2000 | ............... G01G 3/13 |
| EP | 3872489 A1 | 9/2021 | |

OTHER PUBLICATIONS

European (EP) Application No. 20175914.9, "Transducer Array", filed on May 21, 2020, pp. 1-19.

(Continued)

*Primary Examiner* — Francis C Gray
(74) *Attorney, Agent, or Firm* — Nokia Technologies Oy (57) ABSTRACT

An apparatus comprising,
  a monolithic crystal comprising a substrate portion and at least one oscillator;
  a first electrode provided at a first location of the oscillator;
  a second electrode provided at a second location of the oscillator;
  a gap separating the oscillator from the substrate portion, exposing a side surface of the oscillator; and
  one or more tethers that extend across the gap so that the oscillator is supported by the substrate portion.

19 Claims, 5 Drawing Sheets

(56) References Cited

U.S. PATENT DOCUMENTS

2019/0181830 A1  6/2019 Xu et al.

OTHER PUBLICATIONS

Jammes et al., "Service-Oriented Paradigms in Industrial Automation", IEEE Transactions on Industrial Informatics, vol. 1, No. 1, Feb. 2005, pp. 62-70.

Zozulya et al., "The Human Olfactory Receptor Repertoire", Genome Biology, vol. 2, No. 6, 2001, pp. 1-12.

Sato et al., "Architecture of Odor Information Processing in the Olfactory System", Anatomical Science International, vol. 83, 2008, pp. 195-206.

Vassar et al., "Topographic Organization of Sensory Projections to the Olfactory Bulb", Cell, vol. 79, Dec. 16, 1994, pp. 981-991.

Baller et al., "A Cantilever Array-Based Artificial Nose", Ultramicroscopy, vol. 82, No. 1-4, Feb. 2000, pp. 1-9.

Lang et al., "An Artificial Nose Based on a Micromechanical Cantilever Array", Analytica Chimica Acta, vol. 393, No. 1-3, Jun. 30, 1999, pp. 59-65.

Stitzel et al., "Artificial Noses", Annual Review of Biomedical Engineering, vol. 13, 2011, 27 pages.

Malnic et al., "The Human Olfactory Receptor Gene Family", Proceedings of the National Academy of Sciences of the United States of America, vol. 101, No. 8, 2004, pp. 2584-2589.

Zainuddin et al., "Integrated Multichannel Electrochemical—Quartz Crystal Microbalance Sensors for Liquid Sensing", IEEE Access, vol. 8, 2020, pp. 3668-3676.

Winters et al., "A Dual Lateral-Field-Excited Bulk Acoustic Wave Sensor Array", IEEE Transactions on Ultrasonics, Ferroelectrics, and Frequency Control, vol. 60, No. 3, Mar. 2013, pp. 573-578.

"COMSOL Multiphysics®", Comsol, Retrieved on Sep. 7, 2021, Webpage available at : https://www.comsol.com/comsol-multiphysics.

Toan et al., "An Investigation of Processes for Glass Micromachining", Micromachines, vol. 7, No. 3, Mar. 2016, 12 pages.

Ressler et al., "Information Coding in the Olfactory System: Evidence for a Stereotyped and Highly Organized Epitope Map in the Olfactory Bulb", Cell, vol. 79, Dec. 30, 1994, pp. 1245-1255.

Nakamura et al., "A Cyclic Nucleotide-Gated Conductance in Olfactory Receptor Cilia", Nature, vol. 325, Jan. 29, 1987, pp. 442-444.

Tatsuma et al., "Multichannel Quartz Crystal Microbalance", Analytical Chemistry, vol. 71, No. 17, Sep. 1, 1999, pp. 3632-3636.

Fatemi et al., "Performance optimization of lateral-mode thin-film piezoelectric-on-substrate resonant systems", Electronic Theses and Dissertations, 2015, 148 pages.

Extended European Search Report received for corresponding European Patent Application No. 20199377.1, dated Mar. 17, 2021, 9 pages.

* cited by examiner

OSCILLATOR APPARATUS

RELATED APPLICATION

This application claims priority to the European patent application number 20199377.1, filed on Sep. 30, 2020, the content of which is incorporated herein by reference in its entirety.

TECHNOLOGICAL FIELD

Examples of the present disclosure relate to an apparatus. Some relate to an oscillator apparatus that can be coupled to one or more sensors to enable parameters to be detected and/or identified.

BACKGROUND

Transducers for converting an input signal from a sensor into an electrical output signal for processing are known. When miniaturizing transducers it would be useful to ensure that the electrical output signal has a high quality factor (Q-factor). However, this is difficult.

BRIEF SUMMARY

According to various, but not necessarily all, embodiments there is provided an apparatus comprising,
  a monolithic crystal comprising a substrate portion and at least one oscillator;
  a first electrode provided at a first location of the oscillator;
  a second electrode provided at a second location of the oscillator;
  a gap separating the oscillator from the substrate portion, exposing a side surface of the oscillator; and
  one or more tethers that extend across the gap so that the oscillator is supported by the substrate portion.

In some, but not necessarily all examples the oscillator is sensitive to mass so that a frequency of oscillation of the oscillator provides an indication of mass accumulated on at least one of: the oscillator; the first electrode; or the second electrode.

In some, but not necessarily all examples the apparatus is configured to enable an analyte to enter the gap.

In some, but not necessarily all examples the side surface is functionalized to enable the analyte to accumulate on the side surface of the oscillator.

In some, but not necessarily all examples the tethers are attached to nodal points of the oscillator.

In some, but not necessarily all examples a sum of widths of the tethers is no greater than approximately 40% of a nominal diameter of the oscillator.

In some, but not necessarily all examples the monolithic crystal comprises quartz.

In some, but not necessarily all examples the oscillator has a thickness of at least 0.05 mm.

In some, but not necessarily all examples the first electrode is on a first surface of the oscillator, and wherein the second electrode is on a second surface of the oscillator.

According to various, but not necessarily all, embodiments there is provided a transducer array comprising the apparatus,
  wherein the monolithic crystal comprises an array of oscillators including the oscillator,
  wherein a first array of electrodes includes the first electrode, and
  wherein a second array of electrodes includes the second electrode.

In some, but not necessarily all examples the electrodes within the first array and the second array comprise elongate traces, wherein the elongate traces within the second array are configured to cross over the elongate electrodes within the first array, and wherein the elongate traces are electrically connected to one or more contact pads and the one or more contact pads are located at locations where the electrodes in the second array cross over the electrodes in the first array.

In some, but not necessarily all examples the transducer array is configured to enable the oscillators to be activated individually.

In some, but not necessarily all examples the transducer array is configured to enable the oscillators to be activated in a sequence so that oscillators within a given distance of each other are not activated simultaneously.

In some, but not necessarily all examples the transducer array is configured to enable the oscillators to be activated in a sequence so that a first subset of oscillators can be activated at the same time while a second subset of oscillators are not activated.

In some, but not necessarily all examples the transducer array is configured to provide an output to an artificial intelligence module.

According to various, but not necessarily all, embodiments there is provided a method comprising:
  providing a monolithic crystal comprising a substrate portion;
  providing a first electrode at a first location of the monolithic crystal;
  providing a second electrode at a second location of the monolithic crystal;
  providing a gap through a thickness of the monolithic crystal to define an oscillator, the gap exposing a side surface of the oscillator, wherein the first location and the second location are locations on the oscillator; and
  providing one or more tethers that extend across the gap so that the oscillator is supported by the substrate portion.

In some, but not necessarily all examples providing the gap comprises etching the gap.

According to various, but not necessarily all, embodiments there is provided examples as claimed in the appended claims.

BRIEF DESCRIPTION

Some examples will now be described with reference to the accompanying drawings in which.

DETAILED DESCRIPTION

Examples of the disclosure relate to a transducer apparatus 101 and systems comprising a transducer apparatus 101. The transducer apparatus 101 can be configured to transduce inputs from one or more sensors into an identifiable electrical output signal. This can enable parameters such as chemical analytes to be sensed and identified.

Figure 1:
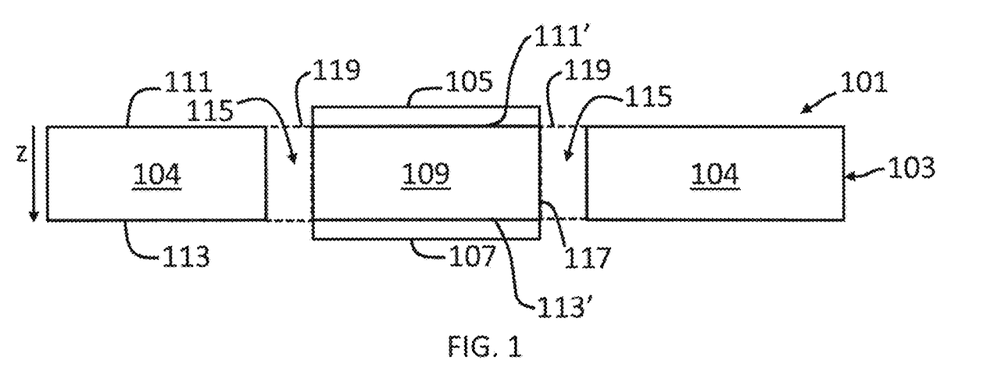
FIG. 1 shows an example of the subject matter described herein.

FIG. 1 schematically illustrates a side view of a transducer apparatus 101 showing a single transducer. In some, but not necessarily all examples the transducer apparatus 101 is a transducer array comprising a plurality of transducers. The transducer apparatus 101 comprises a monolithic crystal 103, a first electrode 105, a second electrode 107 and an oscillator 109.

In at least some examples the oscillator 109 is sensitive to mass so that the resonant frequency of the oscillator 109 will be changed by any mass that is absorbed by a functionalized part such as the electrodes 105, 107 and/or a surface of the oscillator 109. The resonant frequency of the oscillator 109 can then be measured to provide an indication of accumulated mass. The transducers therefore transduce a detected mass into an identifiable electrical output signal.

The oscillator 109 is a portion of the monolithic crystal 103. The oscillator 109 is surrounded by a gap 115 that extends through the entire thickness (z-axis) of the monolithic crystal 103, or at least through enough of the thickness of the monolithic crystal 103 that the oscillator 109 has to be supported by something else.

The gap 115 separates the oscillator 109 from the bulk of the monolithic crystal 103, referred to herein as a substrate portion 104. The gap 115 exposes a side surface 117 of the oscillator 109. One or more tethers 119 extend across the gap 115 so that the oscillator 109 is supported by the substrate portion 104 of the monolithic crystal 103. The tethers 119 are shown in dashed lines to indicate that they do not fully surround the oscillator 109. The gap 115 could be unfilled, enabling analyte such as chemicals to enter the gap 115.

This 'isolated oscillator' design with the gap 115 enables a Q-factor improvement of more than two orders of magnitude compared to an oscillator 109 fabricated on a planar surface (e.g. by trenches or cavities). This provides a significant Q-factor 'budget' that can be 'spent' on miniaturization and forming high density transducer arrays. In addition, the exposed side surface 117 of the oscillator 109 facing the gap 115 can be functionalized to increase the available surface area for sensing without increasing footprint area. Further still, arrays could be stacked in layers without substantially increasing footprint area, wherein analytes can pass through the gap 115 in a first layer to reach an underlying layer.

The monolithic crystal 103 comprises a single crystal. This distinguishes the crystal material from substantially amorphous or substantially polycrystalline materials. The monolithic crystal 103 can be configured with a first surface 111 and a second surface 113. The first surface 111 and the second surface 113 can be flat or substantially flat surfaces. The first surface 111 can occupy an x-y plane, orthogonal to the z-axis. The first surface 111 and the second surface 113 can be opposing surfaces that are positioned on opposite sides of the monolithic crystal 103, separated from each other by the thickness (z-axis) of the monolithic crystal 103. The first surface 111 and the second surface 113 can be parallel or substantially parallel surfaces.

The oscillator 109 can be in-plane with the substrate portion 104, therefore the first surface 111' of the oscillator 109 was a portion of the first surface 111 of the monolithic crystal 103 prior to providing the gap 115, and/or the second surface 113' of the oscillator 109 was a portion of the second surface 113 of the monolithic crystal 103 prior to providing the gap 115.

The tethers 119 can extend through part or all of the thickness (z-axis) of the monolithic crystal 103. The tethers 119 can be a portion of the monolithic crystal 103. For example, the cutting of an incomplete gap 115 around the oscillator 109 will leave behind a bridging portion of monolithic crystal referred to herein as a tether 119. This minimises fabrication requirements. Alternatively, tethers 119 can be provided separately.

In addition to supporting the oscillator 109, the tethers 119 provide a passage on which electrical connections can be deposited to form a circuit to the electrodes 105, 107. For details, refer to FIGS. 5A-5B.

The monolithic crystal 103 can be any suitable size. In some examples the monolithic crystal 103 can have x-axis and/or y-axis dimensions of the order of $10^{\wedge}0$ mm to $10^{\wedge}3$ mm for the widths of the surface of the monolithic crystal 103. Other sizes of monolithic crystal 103 could be used in other examples of the disclosure.

The monolithic crystal 103 can comprise a piezoelectric material. For example, the monolithic crystal 103 may comprise quartz or any other suitable type of material. Other piezoelectric materials include but are not limited to Lithium Niobate and Lithium Tantalate. Of these materials, quartz is most resilient to heating during fabrication and is readily available. Later methods of the present disclosure provide a technique that enables miniaturization of quartz while retaining a high Q-factor. The quartz can be AT-cut quartz, which is usable for frequencies between 0.5 and 300 MHz. Other cuts could be used depending on the use case.

The first electrode 105 is provided at a first location of the oscillator 109 and the second electrode 107 is provided at a second different location of the oscillator 109. In FIG. 1, but not necessarily all examples the first electrode 105 is on the first surface 111 of the monolithic crystal 103 and the second electrode 107 is on the second surface 113 of the monolithic crystal 103. Both electrodes 105, 107 could instead be provided at different locations on the oscillator 109.

The electrodes 105, 107 can comprise any suitable conductive material such as gold. The material used for the electrodes 105, 107 can also be selected so that sensors can be coupled to electrodes 105 and/or 107 to functionalize the electrodes.

In some examples a sensor can be coupled to the electrodes 105, 107 and/or to a surface 111, 113 and/or 117 of the oscillator 109 to functionalize said surface. The sensor can be configured to sense a parameter such as a chemical analyte. The parameter sensed by the sensor will affect the resonant frequency of the oscillator 109. This change in frequency can be detected by addressing the pairs of electrodes 105, 107 that are coupled to the oscillator 109 to activate the oscillator 109. The change in resonant frequency provides an indication of the parameters sensed by the sensors. This therefore enables the transducer apparatus 101 to transduce the sensed chemical into an identifiable electrical output signal and so enable the chemical to be detected.

Figure 2:
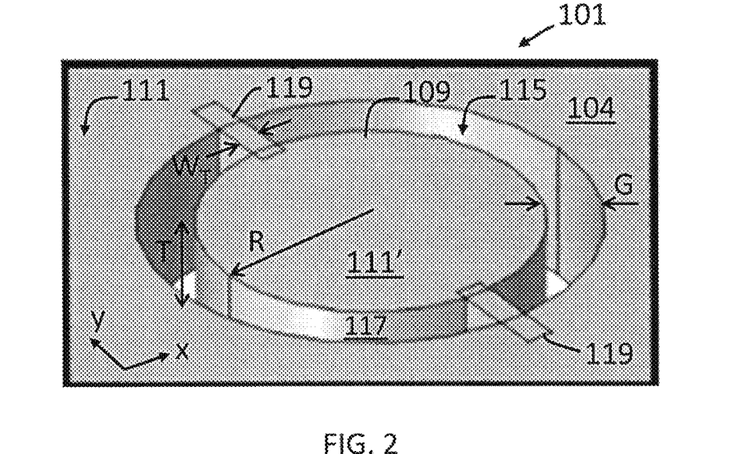
FIG. 2 shows another example of the subject matter described herein.

FIG. 2 provides a three-dimensional view of a transducer apparatus 101 incorporating the features of FIG. 1. The first and second electrodes are not shown. The illustrated geometry and its advantages will be discussed with the understanding that other geometries can still function as sensors (the Sauerbrey equation considers the area of 105 or 107 when determining an active crystal area).

To summarise the illustration, the first surface 111' of the oscillator 109 can be rounded, e.g. circular. The oscillator 109 can be a circular cylinder such that the second surface 113' of the oscillator 109 is also circular. The side surface 117 therefore comprises a single face that extends around the whole circumference of the oscillator 109, orthogonal to the first and second surfaces 111', 113'. The circular design avoids sharp corners/vertices which could potentially become cleavage sites. The gap 115 is annular.

In another example the surfaces 111', 113' of the oscillator 109 form a different shape such as a shape with a plurality of vertices. Optionally, the vertices could be rounded corners. In further examples a non-rounded shape could be used. The side surface 117 could then be described as comprising a plurality of faces.

Since the illustration uses a circular cylindrical design, the geometry of the first and second surfaces 111', 113' of the oscillator 109 will be expressed as a nominal radius R or nominal diameter 2R. If a different or irregular shape is used, the nominal radius R would be taken as the radius of an equivalent circle.

The z-axis thickness of the oscillator 109 is labelled as T, not counting the electrodes 105, 107. This thickness T also refers to the depth of the gap 115, assuming the gap 115 extends all the way through the thickness of the monolithic crystal 103.

The thickness T could be at least a value that makes the oscillator 109 significantly thicker than a 'thin film'. It is therefore not necessary to use complex, low-volume thin film fabrication techniques. A thin film refers to thicknesses from a few 100 nm to a few μm. In at least some examples the thickness T of the oscillator 109 is at least 50 μm (0.05 mm). If quartz is used, a thickness of at least 100 μm would make the quartz wafer robust and easy to handle during fabrication. Intuitively, a lower thickness T would normally result in higher Q-factor. However, examples of the present disclosure enable a high Q-factor with a substantial thickness T (e.g. >350 μm).

The width of the gap 115 in the x-y plane is labelled as G. The gap width G is optionally constant or substantially constant around the whole circumference of the oscillator 109. Assuming an annular gap 115, the width of the gap G can be expressed as the difference between the outer radius and the inner radius of the annulus. The gap width G can be no greater than 2R to reduce stress on the tethers 119. The minimum gap width depends on the precision of the manufacturing technique and the mechanical stability of the monolithic crystal 103.

The width of a tether 119 in the x-y plane is labelled as $W_T$, orthogonal to the span length of the tether 119. The span length of the tether 119 equals the gap width G if the tether 119 spans wholly in the radial direction as shown. The tether width $W_T$ is shown as constant but could vary.

The tether width $W_T$ is thin compared to the diameter 2R of the oscillator 109, to minimise dampening of the oscillator 109 through acoustic energy leakage. In at least some examples the tether width $W_T$ is less than the radius R of the oscillator 109. In further examples the sum of all tether widths $W_T$ of all the tethers 119 (two shown) of the oscillator 109 is no greater than approximately 40% of the diameter 2R. A ratio greater than 40% would result in little Q-factor improvement and therefore a need for additional signal processing (e.g. radio frequency circuitry). Ratios lower than 40% see increasing Q-factor gains, and the best results were below approximately 25% (results discussed later).

Regarding tether locations, a tether 119 can be attached to a nodal point of the oscillator 109. A nodal point is a zero-displacement node of the oscillator 109, for example in a thickness shear (TS) mode or a lateral extensional mode (LEM). By attaching a tether 119 to a nodal point, dampening of the oscillator 109 through acoustic energy leakage is minimized. The node locations can be identified using Multiphysics simulations of the oscillator 109.

Figure 3:
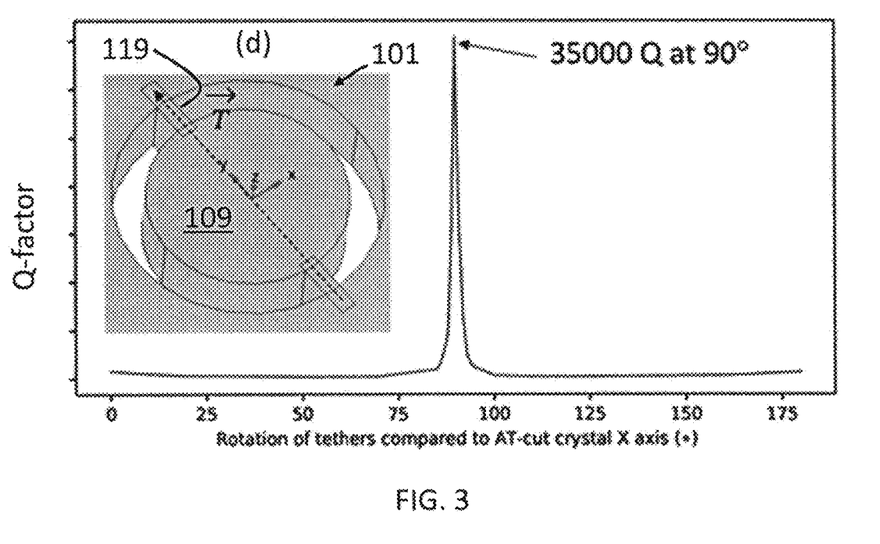
FIG. 3 shows another example of the subject matter described herein.

To demonstrate the value of placing tethers 119 at nodal points, the Q-factor for an AT-cut quartz crystal having the geometry of FIG. 2 was calculated while rotating the orientation vector through two opposing tethers 119 ($\vec{T}$) around a surface normal $\vec{z}$ through the centre of the oscillator 109, and the results are shown in FIG. 3. The vertical axis is Q-factor and the horizontal axis is the angle of the tethers 119 compared to the crystal x-axis. Note that the crystal x-axis is a crystallographic property.

As shown in FIG. 3, the highest Q-factor (θ=35000) was obtained when the angle (θ) between $\vec{T}$ and the x-axis was approximately 90°. It is important to note that this target angle θ is different depending on the dimensions of the oscillator 109.

The Q-factor dropped by half when the angle θ deviated ±1° from 90° but was still very high. It is important to note that there is no set lower limit for Q-factor. A device with very low Q-factor can work with enough signal processing. Therefore, the present disclosure is not limited to θ=90°. FIG. 3 demonstrates that Q-factor improvement is available for angles θ between approximately 70° and approximately 100°, with peak improvements for angles θ within ±5° of 90°. For angles outside these ranges, compromises may be useful elsewhere such as less miniaturization or more signal processing time.

FIG. 3 identifies an implementation in which extremely high Q-factor can be obtained: a cylindrical quartz oscillator 109; one tether 119 at approximately +90° from the x-axis; the other tether 119 at approximately −90° from the x-axis.

The oscillator 109 of FIG. 3 also benefitted from thin tethers 119 (R=600 μm and $W_T$=100 μm such that $W_T$/R=16.67%). Of course, this ratio could be different.

The oscillator 109 of FIG. 3 also had sufficient radius (R=600 μm) that TS nodal points spanned all the way through the thickness T of the oscillator 109 (T=500 μm). If the nodal point does not extend through the full thickness, the fabrication could be modified to limit the thickness and vertical position of the tether 119 based on the size and location of the nodal point. However, fabrication would be quicker if the tether 119 could be left at thickness T. Calculations revealed that a radius R of at least approximately 500 μm enables a TS nodal point to span through the entire thickness (in this case T=500 μm). Therefore, when R is approximately equal to or greater than T, TS nodal points become readily available. For geometries not suited to TS nodal points, LEM nodal points could be used. LEM modes can work for oscillators at least where T<2500 μm and where R<T.

Although two tethers 119 are shown in FIGS. 2 and 3, it would be understood that any number of tethers 119 could be used. If attaching tethers 119 to nodal points the number of tethers 119 may be no more than the number of nodal points. It may be more efficient to limit to no more than two tethers 119 even if there are more than two available nodal points. If only one tether 119 is provided, it may need to be stronger (e.g. thicker) than if two tethers are provided.

Some more insights into Q-factor can be derived by considering the results of a set of designs that varied radius R, tether width $W_T$, and mode (TS or LEM). Table 1 below is visually complemented by FIG. 4 which uses simple schematic representations of the oscillator 109 and tethers 119 at correct relative scales, to highlight the geometric differences between the designs.

Figure 4:
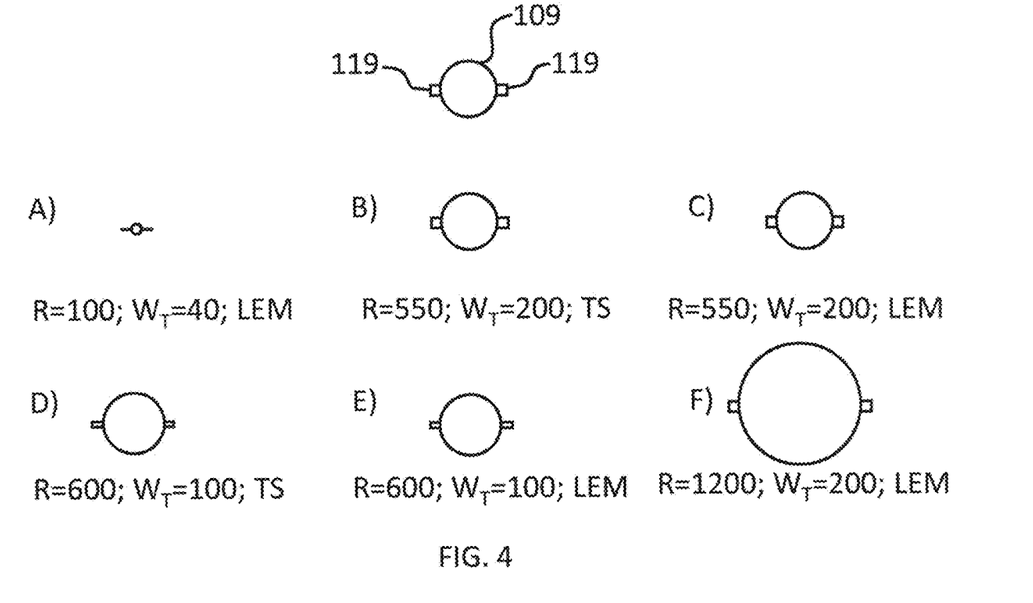
FIG. 4 shows another example of the subject matter described herein.

TABLE 1 simulation results for six designs.

| Design | R (μm) | G (μm) | $W_T$ (μm) | Mode Freq* (MHz) | Mode | Sensitivity (ng/Hz) | Δf (Hz) | Q-factor |
|---|---|---|---|---|---|---|---|---|
| A | 100 | 200 | 40 | 18.89 | LEM | 0.72 | 115 | 6300 |
| B | 550 | 200 | 200 | 3.01 | TS | 4.36 | 1597 | 17862 |
| C | 550 | 200 | 200 | 3.45 | LEM | 16.47 | 169 | 5149 |
| D | 600 | 200 | 100 | 2.97 | TS | 2.40 | 1724 | 35000 |
| E | 600 | 200 | 100 | 3.16 | LEM | 22.60 | 196 | 306182 |
| F | 1200 | 200 | 200 | 3.19 | TS | 3.94 | 1866 | 9748 |

(*Fundamental frequency.)

For Table 1, the Saurbrey frequency shift Δf was calculated based on a computational simulation with an additional layer (2.6 g/cm²) of a thin film (1 μm) on the first electrode 105. All other constants were as described in relation to FIG. 3. In fact, FIG. 3 represents design D.

It should be noted that all the Q-factors above are very good for a miniaturized quartz device. Observations on individual results are made below:

In design A, the in-plane LEM has a small out-of-plane movement, resulting in some air damping. A large zero-displacement node running along its first surface 111' allows a tether connection to the substrate portion 104 with minimum acoustic energy loss.

In design B, the TS mode with a large zero-displacement node that extends through the full thickness T represents an excellent candidate for a high-Q, high-sensitivity quartz resonator.

In design C, the LEM mode has a lower Q-factor than the TS mode, however it is predicted to have greater sensitivity.

In design D, the Q-factor is higher than design B. A relatively narrow zero-displacement node of the TS mode compared to design B required a thinner tether width $W_T$ than design B to minimise energy loss. Therefore, design D may require more precise fabrication of the tether 119 than design B, but can achieve a high Q-factor.

In design E, the LEM mode presents the same tether challenge as TS mode (design D), however it exhibits a much higher Q-factor at the expense of lower sensitivity.

Design F is a dual-axis TS mode resonator that enables both high-Q and high sensitivity. In this mode, instead of uni-directional movement at each cross section of the resonating structure parallel to the substrate, two distinct axes of movement are formed. This enables access to more nodal points and thus allows for high-Q, high sensitivity applications.

Looking at the results as a whole, Table 1 demonstrates that reducing tether width (more specifically $\Sigma W_T/2R$) correlates with an improvement in Q-factor, at least for radii smaller than design F. Observe that the Q-factor of design D increased relative to design B with roughly the same R, by halving $W_T$. The same can be seen for design E compared to design C.

In some, but not necessarily all examples a tether width of 100-200 μm is recommended, providing a reasonable trade-off between performance, ease of fabrication using techniques discussed herein, and mechanical robustness.

Looking at the performance of TS relative to LEM, it is believed that the small out of plane movement in TS mode reduces energy lost to surrounding air molecules thus improving the Q-factor and therefore signal to noise ratio SNR. Although other modes (e.g. LEM) may achieve improved mass sensitivity and Q-factor, extra fabrication steps required for creating an oscillator 109 with LEM node tethers 119 may be needed. Therefore, in some implementations the tethers 119 are attached to TS nodes for fabrication reasons.

The three-dimensional nature of the oscillator 109 provides the opportunity to functionalize the side surface 117 to increase the effective sensing area of the oscillator 109 relative to the two-dimensional footprint of the oscillator 109. This grants enhanced sensitivity compared to thin (conventional) MEMS (microelectromechanical system) design.

The side surface 117 can be thick enough that the three-dimensional surface area of the oscillator 109 is more than 1% greater than the two-dimensional nominal cross-sectional area of the oscillator 109. However, in the above designs, the side surface 117 can be much thicker. The 3D surface area of the oscillator 109 can be at least 1.5 times greater than the 2D cross-sectional area. In some cases, the side surface 117 could comprise more sensors than the other sensor locations 105/107/111'/113'.

In an example, the frequency shift with and without side surface functionalization was compared, by simulating placement of a 1 μm thick uniform layer (2.6 g/cm²) on surfaces of a quartz oscillator 109 of R=100 μm and T=500 μm. The results are shown in Table 2:

TABLE 2 mass loading sensitivity comparison.

| Mass loading | Δf (Hz) | Δf/cm² |
|---|---|---|
| Top surface only | 115 | 3660 |
| Top and side surface | 117409 | 373724 |

The results of Table 2 show two orders of magnitude of improvement in mass loading sensitivity per unit area when the side surface 117 is exposed and utilised for mass sensing. By contrast, a side surface 117 is practically non-existent in a MEMS oscillator, so MEMS design typically considers components to be two-dimensional.

Figure 5A:
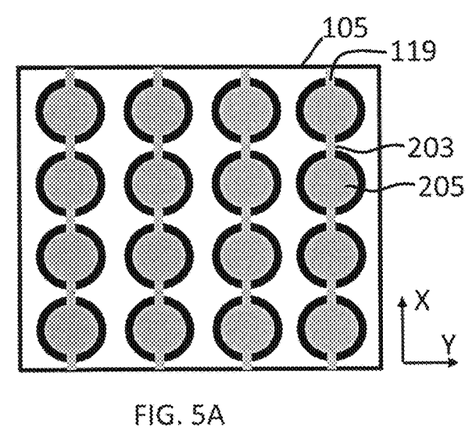
FIGS. 5A, 5B show another example of the subject matter described herein.
Figure 5B:
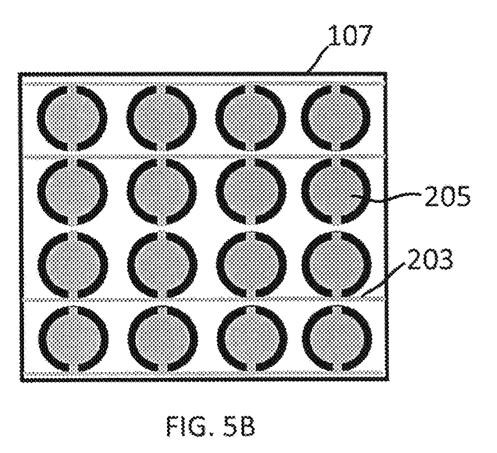

The preceding description has focused on a single oscillator 109 with potential application for transducer arrays. The following description provides an example of a transducer array. FIGS. 5A-5B provide example electrode layouts for a transducer array such as a quartz crystal microbalance (QCM) array or other array.

FIG. 5A shows that the first electrode 105 could be a first electrode array. FIG. 5B shows that the second electrode 107 could be a second electrode array. The electrodes in the arrays 105, 107 can have any suitable shape and configuration. In some examples the electrodes can comprise elongate traces 203 that extend across the respective surfaces 111, 113 of the monolithic crystal 103. The elongate traces 203 in the first array 105 can extend towards a first direction and the elongate traces 203 in the second array 107 can extend towards a second direction where the second direction is not parallel to the first direction. This ensures that the electrodes within the respective arrays 105, 107 cross over each other at a plurality of intersecting points. The elongate traces 203 in the second array 107 could extend in a direction that is perpendicular to, or substantially perpendicular to, the elongate traces 203 in the first array 105, making the electrodes X-electrodes and Y-electrodes.

The arrays of electrodes 105, 107 are positioned on the monolithic crystal 103 so that the electrodes in the first array 105 are positioned, at least partially, overlaying the electrodes in the second array 107. This enables electrical connections to a plurality of oscillators 109.

In these examples the elongate traces 203 in each array 105, 107 are substantially parallel to each other. As shown in FIG. 5B, the elongate traces 203 in the second array 107 extend in a direction that is perpendicular, or substantially perpendicular to the elongate traces in the first array 105. This enables a matrix of cross over points to be provided when the two arrays 105, 107 of electrodes are added to the monolithic crystal 103. In the example shown in FIGS. 5A-5B the elongate traces 203 in the first array 105 extend in a vertical direction while the elongate traces 203 in the second array 107 extend in a horizontal direction. It is to be appreciated that other orientations and configurations for the electrodes 203 could be used in other examples of the disclosure.

In the example shown in FIGS. 5A, 5B the elongate traces 203 are electrically connected to one or more contact pads 205. In the example shown the contact pads 205 comprise circular portions. The contact pads 205 provide an increased surface area of the electrodes 105, 107 within the region of the cross over points. It is to be appreciated that other shapes and configurations could be used for the contact pads 205 in other examples of the disclosure. The contact pads 205 are on the first and second surfaces 111', 113' of the oscillator 109.

As shown in FIG. 5A, the elongate traces 203 of the first array 105 can extend parallel to the orientation of the tethers 119, electrically interconnecting contact pads 205 in a column. Accordingly, the elongate traces 203 of the first array 105 can extend along the tethers 119, on the top surfaces 111 of the tethers 119.

The elongate traces 203 of the second array 107 can electrically connect to the contact pads 205 of the second array 107 via the bottom surfaces 113 of the tethers 119. Since the elongate traces 203 of the second array 107 may be at a different orientation, e.g. perpendicular, relative to the tethers 119, the arrangement of FIG. 5B can be provided. FIG. 5B shows that the contact pads 205 of the second array 107 are branched off from the elongate traces 203 of the second array 107, with each tether 119 forming a branch. An elongate trace 203 of the second array 107 can electrically interconnect a row of contact pads 205.

In the example shown in FIGS. 5A-5B the arrays of electrodes 105, 107 each comprise four elongate traces 203 each electrically connected to four contact pads 205. It is to be appreciated that other numbers of elongate traces 203 and contact pads 205 could be provided in other examples of the disclosure.

The electrode arrays 105, 107 and components 203, 205 within the arrays 105, 107 can have any suitable dimensions. For example, the contact pads 205 could have a diameter between 0.01 mm to 5 mm and could be spaced by between 0.01 mm to 10 mm. Different ranges could be used in other examples of the disclosure. For instance, in some examples the arrays of electrodes 105, 107 could be designed on a nanometre scale, if smaller oscillators are used. This could enable a large number of electrodes to be provided within each of the arrays of electrodes 105, 107 and so could provide a large number of transducers within the transducer apparatus 101.

In some examples, the transducer apparatus 101 can be mounted to a circuit board which drives the oscillation via soldering, gold bumps, gold wire bonding, anisotropic conductive film (ACF) or anisotropic conductive elastomer.

Figure 6A:
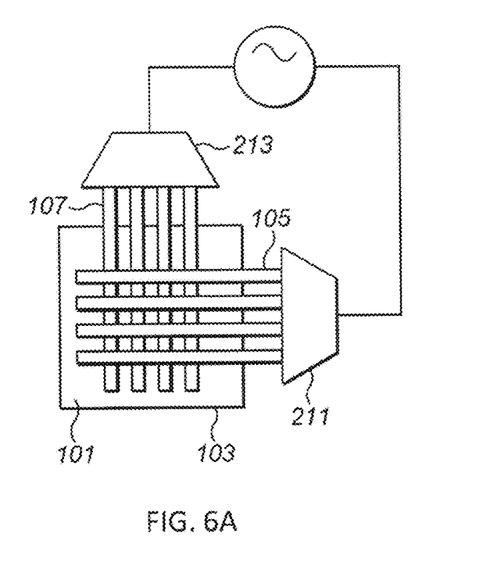
FIGS. 6A, 6B show another example of the subject matter described herein.
Figure 6B:
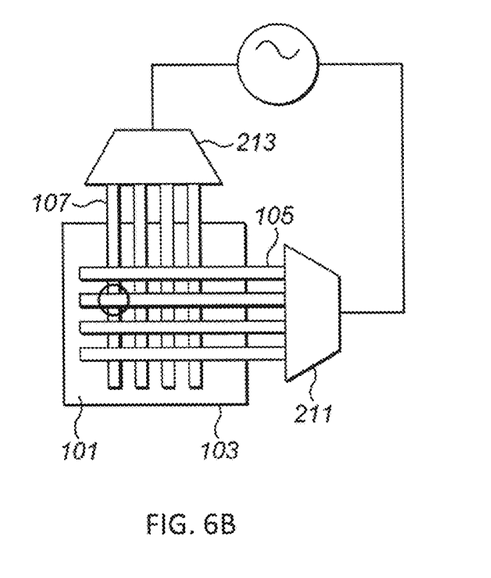

FIGS. 6A-6B illustrate the electrode arrays 105, 107 coupled to the monolithic crystal 103 and configured to create a transducer array 101. In this example the first array of electrodes 105 is provided on the top surface 111 of the monolithic crystal 103 and the second array of electrodes 107 is provided on the bottom surface 113 of the monolithic crystal 103. In this illustration the first array of electrodes 105 extend in a horizontal direction and the second array of electrodes 107 extend in a vertical direction.

In the example of FIGS. 6A-6B each of the arrays of electrodes 105, 107 comprises four electrodes 203, for illustrative purposes only. This creates sixteen cross over points arranged in a 4×4 matrix. The cross over points of the electrodes 203 enable oscillators 109 to be created within the monolithic crystal 103 as described above and so provide a transducer array 101.

In the example shown in FIGS. 6A-6B a first multiplexer 211 is coupled to the electrodes in the first array 105 and a second multiplexer 213 is coupled to the electrodes in the second array 107. The multiplexers 211, 213 can be configured to enable the electrodes within the arrays 105, 107 to be addressed individually so that a signal can be provided to a first electrode within an array 105, 107 without providing a signal to other electrodes within the same array 105, 107. A passive matrix addressing scheme allows ease of fabrication and minimizes front-end circuitry. According to a passive matrix addressing scheme, $\log_2(mn)$ control signals can address an m×n matrix.

The oscillator design described herein works at low fundamental frequencies (e.g. <200 MHz) so radio frequency circuitry may not be needed. This enables the use of field programmable gate arrays (FPGA) or similar which operate at lower frequencies.

In some examples the transducer array 101 can be configured to enable the oscillators 109 to be activated in a sequence so that oscillators 109 within a given distance of each other are not activated simultaneously. The given distance can ensure that there is no cross talk between the oscillators 109 that affects the measurements of the resonant frequencies. The size of the distance that is necessary to avoid the cross talk will depend on the size of the contact pads 205 within the electrode arrays 105, 107 and the spacing between the electrodes.

In some examples the transducer array 101 can be configured to enable the oscillators 109 to be activated in a sequence so that a first subset of oscillators 109 can be activated at the same time while a second subset of oscillators 109 are not activated. For example, two or more oscillators 109 that are separated by more than a minimum distance can be activated simultaneously while any oscillators 109 within the minimum distance could remain deactivated so as to avoid cross talk.

In the example shown in FIG. 6B the transducer array 101 is configured to enable the oscillators 109 to be activated individually by addressing the electrodes within the arrays 105, 107 individually. This reduces cross talk between oscillators 109 as only one oscillator 109 is activated at a given time.

Figure 7:
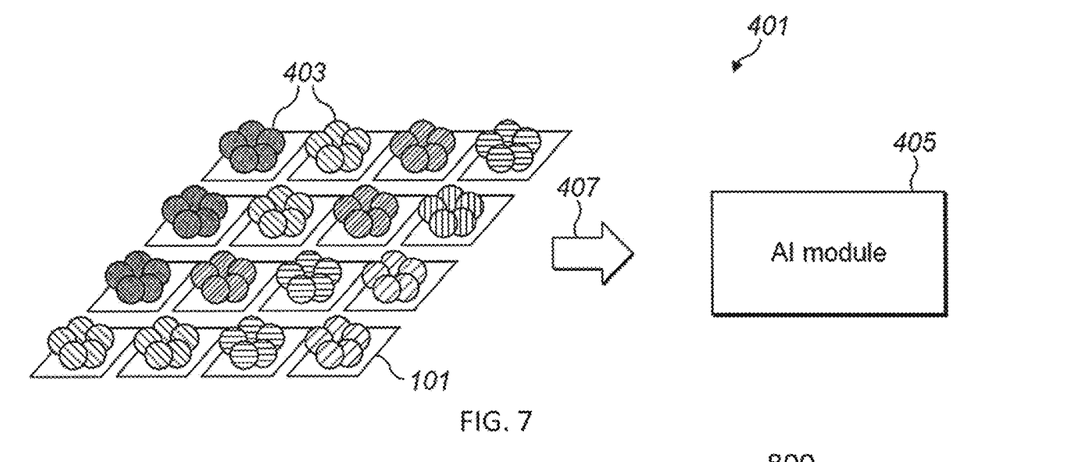
FIG. 7 shows another example of the subject matter described herein.

FIG. 7 schematically illustrates a system 401 comprising a transducer apparatus 101 such as a transducer array, a plurality of sensors 403 and an artificial intelligence module 405. The system 401 shown in FIG. 7 can be used to sense parameters such as chemicals. This could be used as an artificial nose or other similar application. It is to be appreciated that the transducer array 101 could also be used in other types of systems. An artificial nose benefits from a miniaturized transducer array because of the potentially large number of sensors and higher required sensitivity, so the ability to miniaturize quartz while retaining a high Q-factor is beneficial.

The transducer array 101 can be as described above. Corresponding reference numerals are used for corresponding features. In the example shown the transducer array 101 comprises sixteen pixels where each pixel comprises an oscillator 109 formed from a portion of monolithic crystal 103 between the cross over points of two contact pads 205 from the electrode arrays 105, 107.

A plurality of sensors 403 are coupled to the transducer array 101 so that the frequency of oscillation of the oscillators 109 is dependent upon one or more chemicals sensed by the plurality of sensors 403. Each oscillator 109 may comprise a different sensor 403, that is, a sensor configured to sense a different analyte.

The sensors 403 can be coupled to the contact pads, or any other suitable portion, of one or both of the electrode arrays 105, 107. The sensors 403 could be coupled to the side surfaces 117 of the oscillators 109 as mentioned. The sensors 403 can be coupled to contact pads so that the output signal provided by the oscillator 109 is dependent upon whether or not the sensors 403 have sensed a chemical.

In some examples plurality of sensors 403 could comprise genetically modified sensors. The genetically modified sensors 403 could comprise at least one of viral particles, desiccation tolerant cells, synthetic peptides, randomized DNA, proteins and receptors or any other suitable biological material. The genetically modified sensors 403 can be modified to sense chemicals in a gas phase and/or a liquid phase.

The genetically modified sensors 403 may be adsorbed to the contact pads 205 of the electrodes 203. The adsorption could be chemical adsorption or physical adsorption. The chemical bond formed in a chemical adsorption process could be a covalent bond, a partially covalent bond or any other suitable type of bond. The type of coupling that is used to couple sensors 403 to the contact pads 205 would be dependent upon the types of sensors 403 that are used and the materials used for the electrodes 203 and contact pads 205.

In other examples the plurality of sensors 403 can comprise chemical modification of the surface of the contact pads 205 and/or electrodes 203. The chemical modification could comprise a chemical coating such as a polymer provided on the surface of the contact pad 205 and/or electrode 203. The chemical coating could be configured to enable chemicals to be accumulated on the surface of the contact pad 205.

The artificial intelligence module 405 is coupled to the transducer array 101 and configured to receive an electrical output signal from the transducer array 101.

The output provided by each of the pixels within the transducer array 101 is dependent upon the chemicals that are sensed by the sensors 403 coupled to the pixels. The transducer array 101 therefore provides an electrical output signal that is dependent upon one or more chemicals being sensed by the plurality of sensors 403. Different pixels can have different types of sensors 403 coupled to them so that different pixels provide different electrical output signals. The different electrical output signals from the pixels within the transducer array 101 can be combined so as to provide an identifiable electrical output signal 407.

The identifiable electrical output signal 407 comprises information that enable one or more chemicals or types of chemicals to be identified. The identifiable electrical output signal 407 can comprise information that enables a plurality of different chemicals to be identified. In some examples the identifiable electrical output signal 407 can comprise information that enables a concentration of the chemicals or types of chemicals to be determined. The chemicals can comprise any suitable types of chemicals including bio-chemicals.

The identifiable electrical output signal 407 from the transducer array 101 is provided to the artificial intelligence module 405 so as to enable the identifiable electrical output signal 407 to be classified. The artificial intelligence module 405 can be configured to use a pattern recognition algorithm, or any other suitable type of algorithm, to classify the identifiable electrical output signal 407. Classifying the electrical output signal 407 comprises one or more of: determining an identity of a chemical, determining a class of chemicals, determining concentration of a chemical. The artificial intelligence module may comprise instructions implemented by an electronic processor.

The artificial intelligence module may use machine learning which can include statistical learning. Machine learning is a field of computer science that gives computers the ability to learn without being explicitly programmed. The computer learns from experience E with respect to some class of tasks T and performance measure P if its performance at tasks in T, as measured by P, improves with experience E. The computer can often learn from prior training data to make predictions on future data. Machine learning includes wholly or partially supervised learning and wholly or partially unsupervised learning. It may enable discrete outputs (for example classification, clustering) and continuous outputs (for example regression). Machine learning may for example be implemented using different approaches such as cost function minimization, artificial neural networks, support vector machines and Bayesian networks for example. Cost function minimization may, for example, be used in linear and polynomial regression and K-means clustering. Artificial neural networks, for example with one or more hidden layers, model complex relationship between input vectors and output vectors. Support vector machines may be used for supervised learning. A Bayesian network is a directed acyclic graph that represents the conditional independence of a number of random variables.

Figure 8:
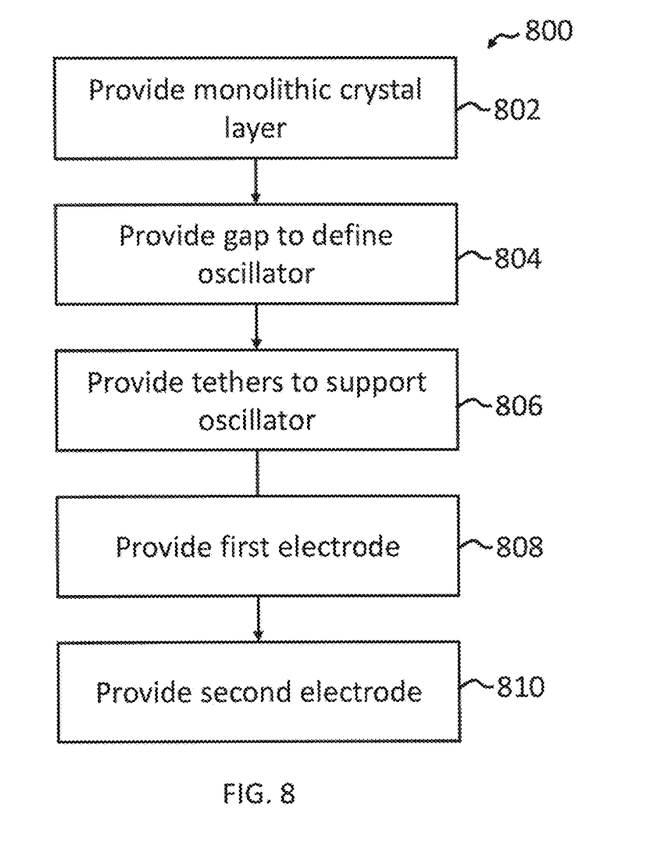
FIG. 8 shows another example of the subject matter described herein.

FIG. 8 is a flowchart for a method of fabricating a transducer apparatus 101. The method comprises:
- at block 802, providing a monolithic crystal 103 comprising a substrate portion 104;
- at block 804, providing a gap 115 through a thickness of the monolithic crystal 103 to define an oscillator 109, the gap 115 exposing a side surface 117 of the oscillator 109, wherein the first location and the second location are locations on the oscillator 109;
- at block 806, providing one or more tethers 119 that extend across the gap 115 so that the oscillator 109 is supported by the substrate portion 104;
- at block 808, providing a first electrode 105 at a first location of the monolithic crystal 103; and at block 810, providing a second electrode 107 at a second location of the monolithic crystal 103.

In some, but not necessarily all examples, providing the gap 115 may comprise etching the gap 115. This is a more efficient and scalable technique than deposition/growth-based techniques. However, some applications could instead call for another technique such as deposition.

Etching the gap 115 may comprise providing a mask such as a dry film photoresist, and etching around the mask.

The same etching step could both create the gap 115 and leave behind the tethers 119, performing both blocks 804 and 806.

Figure 9:
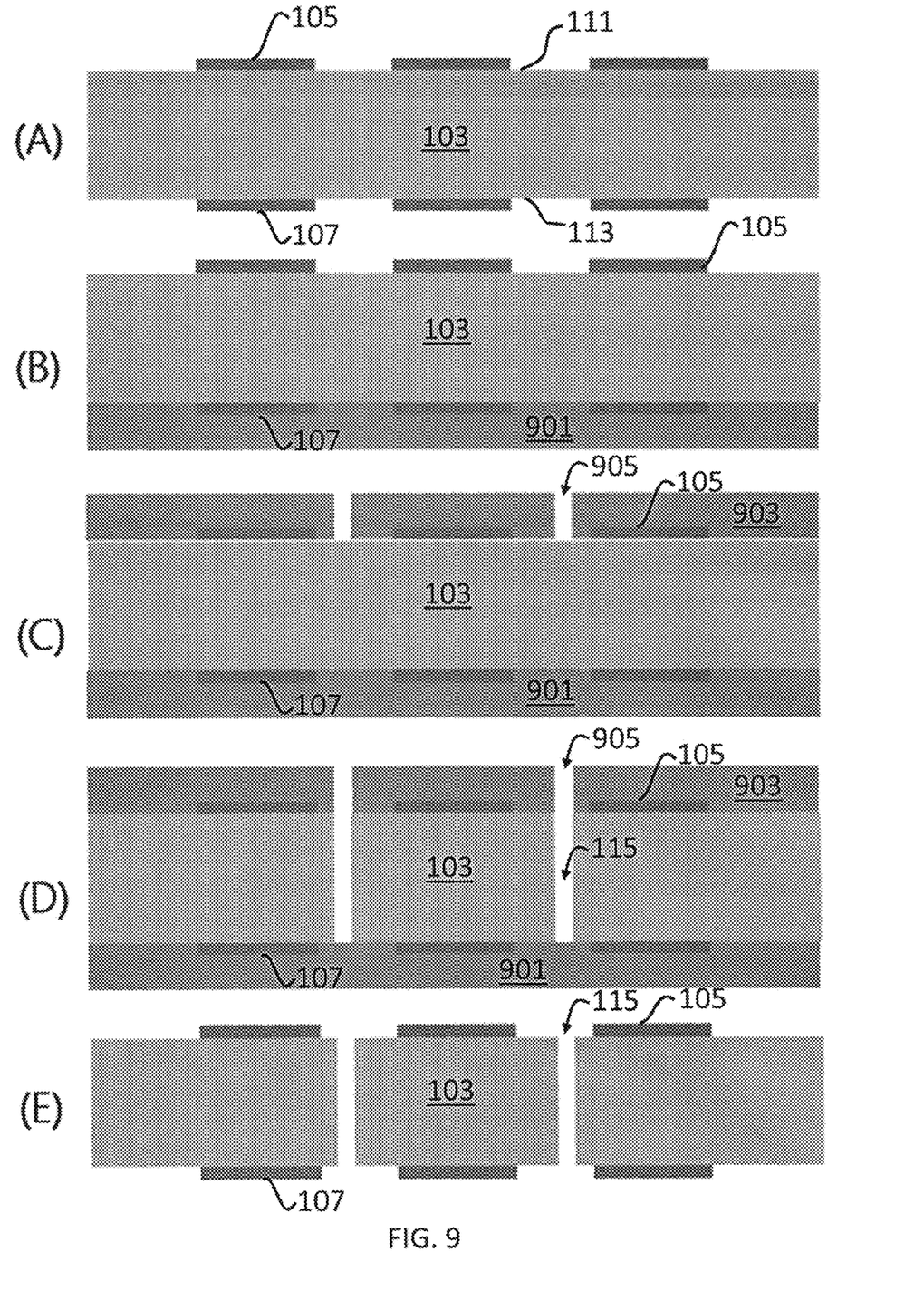
FIG. 9 shows another example of the subject matter described herein.

FIG. 9 illustrates a transducer apparatus 101 in different states of fabrication, according to an example fabrication process.

In FIG. 9 the electrodes 105, 107 are illustrated as being provided prior to etching the gap 115. However, in an example alternative implementation the electrodes 105, 107 are provided after etching the gap 115.

The first electrode array 105 can be created on the monolithic crystal 103 using a lift-off process. The second electrode array 107 can be created using a lift-off process on the rear side of the monolithic crystal 103. This results in the illustrated State (A).

A first mask 901 is provided on the second surface 113, optionally when the second electrode array 107 is being provided. The first mask 901 could be a layer of photoresist. The photoresist can be dry film photoresist. The photoresist layer can be thick, such as thicker than 50 μm (e.g. approximately 100 μm). This results in the illustrated State (B).

A second mask 903 can be provided on the first surface 111 of the monolithic crystal 103. The same mask type can be used. Gaps 905 in the second mask 903 can be formed by deposition and patterning. This results in the illustrated State (C). The illustrated gaps 905 in the second mask 903 form a pattern defining the locations for the gaps 115 in the monolithic crystal 103.

Then, the pattern in the second mask 903 is etched through to create the gaps 115 in the monolithic crystal 103. The etching technique may comprise anisotropic etching. In a first example, plasma etching is a suitable technique to produce small vertical features in quartz. An example technique is reactive ion etching, optionally using a $SF_6$-based plasma. This results in the illustrated state (D).

The reactive ion etching step can be optionally performed in two steps, where each surface 111, 113 of the monolithic crystal 103 (front & back) is etched halfway to ensure complete etching of through-hole structures (gaps 115).

The low selectivity of regular photoresist masks (3 to 4) or the added complexity of metal masks with better selectivity (>30) can make it difficult to etch features through the whole thickness of quartz wafers (400-500 μm). However, by using thick dry photoresist film masks 901, 903 the difficulty can be obviated. Conservatively, dry film photoresists will produce a resolution similar to their thickness of approximately 30 μm to approximately 100 μm, which makes it compatible with the example gap sizes G and tether widths $W_T$ described above. Therefore, in an example the photoresist film thickness is no more than approximately 250% of the smallest required resolution (G or $W_T$).

Stripping the masks 901, 903 finishes the transducer apparatus 101, as shown in State (E).

The transducer apparatus 101 can then be functionalized. An example process uses silane-based chemistry (e.g. 3-aminopropyltriethoxysilane). If biomolecule biosensors are to be provided, the amine group can be used to couple biomolecules.

The above method uses reactive ion etching. However, other methods are available including:

Laser induced deep etching (LIDE), wherein a laser pulse modifies a substrate through its entire thickness, and the modified areas are then removed by wet chemical etching; and Controlled erosion processes comprising blasting a surface with microscopic abrasive particles.

The blocks illustrated in the FIGS. 7-9 may represent steps in a method. The illustration of a particular order to the blocks does not necessarily imply that there is a required or preferred order for the blocks and the order and arrangement of the block may be varied. Furthermore, it may be possible for some blocks to be omitted.

Where a structural feature has been described, it may be replaced by means for performing one or more of the functions of the structural feature whether that function or those functions are explicitly or implicitly described.

In some but not necessarily all examples, the transducer apparatus 101 may be part of the Internet of Things forming part of a larger, distributed network. In some examples the transducer apparatus 101 is a wearable device or a module thereof. As used here 'module' refers to a unit or apparatus that excludes certain parts/components that would be added by an end manufacturer or a user.

The sensing and processing of the data, whether local or remote, may be for the purpose of health monitoring, data aggregation, patient monitoring, vital signs monitoring or other purposes.

The above described examples find application as enabling components of:
automotive systems; telecommunication systems; electronic systems including consumer electronic products; distributed computing systems; media systems for generating or rendering media content including audio, visual and audio visual content and mixed, mediated, virtual and/or augmented reality; personal systems including personal health systems or personal fitness systems; navigation systems; user interfaces also known as human machine interfaces; networks including cellular, non-cellular, and optical networks; ad-hoc networks; the internet; the internet of things; virtualized networks; and related software and services.

The term 'comprise' is used in this document with an inclusive not an exclusive meaning. That is any reference to X comprising Y indicates that X may comprise only one Y or may comprise more than one Y. If it is intended to use 'comprise' with an exclusive meaning then it will be made clear in the context by referring to "comprising only one . . . " or by using "consisting".

In this description, reference has been made to various examples. The description of features or functions in relation to an example indicates that those features or functions are present in that example. The use of the term 'example' or 'for example' or 'can' or 'may' in the text denotes, whether explicitly stated or not, that such features or functions are present in at least the described example, whether described as an example or not, and that they can be, but are not necessarily, present in some of or all other examples. Thus 'example', 'for example', 'can' or 'may' refers to a particular instance in a class of examples. A property of the instance can be a property of only that instance or a property of the class or a property of a sub-class of the class that includes some but not all of the instances in the class. It is therefore implicitly disclosed that a feature described with reference to one example but not with reference to another example, can where possible be used in that other example as part of a working combination but does not necessarily have to be used in that other example. Although examples have been described in the preceding paragraphs with reference to various examples, it should be appreciated that modifications to the examples given can be made without departing from the scope of the claims.

Features described in the preceding description may be used in combinations other than the combinations explicitly described above.

Although functions have been described with reference to certain features, those functions may be performable by other features whether described or not.

Although features have been described with reference to certain examples, those features may also be present in other examples whether described or not.

The term 'a' or 'the' is used in this document with an inclusive not an exclusive meaning. That is any reference to X comprising a/the Y indicates that X may comprise only one Y or may comprise more than one Y unless the context clearly indicates the contrary. If it is intended to use 'a' or 'the' with an exclusive meaning then it will be made clear in the context. In some circumstances the use of 'at least one' or 'one or more' may be used to emphasis an inclusive meaning but the absence of these terms should not be taken to infer any exclusive meaning.

The presence of a feature (or combination of features) in a claim is a reference to that feature or (combination of features) itself and also to features that achieve substantially the same technical effect (equivalent features). The equivalent features include, for example, features that are variants and achieve substantially the same result in substantially the same way. The equivalent features include, for example, features that perform substantially the same function, in substantially the same way to achieve substantially the same result.

In this description, reference has been made to various examples using adjectives or adjectival phrases to describe characteristics of the examples. Such a description of a characteristic in relation to an example indicates that the characteristic is present in some examples exactly as described and is present in other examples substantially as described.

Whilst endeavoring in the foregoing specification to draw attention to those features believed to be of importance it should be understood that the Applicant may seek protection via the claims in respect of any patentable feature or combination of features hereinbefore referred to and/or shown in the drawings whether or not emphasis has been placed thereon.

The invention claimed is:

1. An apparatus comprising,
   a monolithic crystal comprising a substrate portion and at least one oscillator;
   a first electrode provided at a first location of the oscillator;
   a second electrode provided at a second location of the oscillator;
   a gap separating the oscillator from the substrate portion, exposing a side surface of the oscillator; and
   one or more tethers that extend across the gap so that the oscillator is supported by the substrate portion;
   wherein the apparatus is configured to enable an analyte to enter the gap; and
   wherein the side surface is functionalized to enable the analyte to accumulate on the side surface of the oscillator.

2. The apparatus of claim 1, wherein the oscillator is sensitive to mass so that a frequency of oscillation of the oscillator provides an indication of mass accumulated on at least one of: the oscillator; the first electrode; or the second electrode.

3. The apparatus of claim 1, wherein respective ones of the one or more tethers are attached to respective nodal points of the oscillator.

4. The apparatus of claim 1, wherein a sum of widths of the tethers is no greater than 40% of a nominal diameter of the oscillator.

5. The apparatus of claim 1, wherein the monolithic crystal comprises quartz.

6. The apparatus of claim 1, wherein the oscillator has a thickness of at least 0.05 mm.

7. The apparatus of claim 1, wherein the first electrode is on a first surface of the oscillator, and wherein the second electrode is on a second surface of the oscillator.

8. The apparatus of claim 1, wherein the oscillator has a thickness such that the side surface area of the oscillator is more than 1% greater than a two-dimensional nominal cross-sectional area of the oscillator.

9. The apparatus of claim 8, wherein the side surface area of the oscillator is at least 1.5 times greater than the two-dimensional nominal cross-sectional area of the oscillator.

10. A transducer array comprising an apparatus, the apparatus comprising:
    a monolithic crystal comprising a substrate portion and at least one oscillator;
    a first electrode provided at a first location of the oscillator;
    a second electrode provided at a second location of the oscillator;
    a gap separating the oscillator from the substrate portion, exposing a side surface of the oscillator; and
    one or more tethers that extend across the gap so that the oscillator is supported by the substrate portion;
    wherein the apparatus is configured to enable an analyte to enter the gap;
    wherein the side surface is functionalized to enable the analyte to accumulate on the side surface of the oscillator; and
    wherein the monolithic crystal comprises an array of oscillators including the oscillator,
    wherein a first array of electrodes includes the first electrode, and
    wherein a second array of electrodes includes the second electrode.

11. The transducer array of claim 10, wherein the electrodes within the first array and the second array comprise elongate traces, wherein the elongate traces within the second array are configured to cross over the elongate electrodes within the first array, and wherein the elongate traces are electrically connected to one or more contact pads and the one or more contact pads are located at locations where the electrodes in the second array cross over the electrodes in the first array.

12. The transducer array of claim 10, wherein the transducer array is configured to enable the oscillators to be activated individually; or
    wherein the transducer array is configured to enable the oscillators to be activated in a sequence so that oscillators within a given distance of each other are not activated simultaneously; or
    wherein the transducer array is configured to enable the oscillators to be activated in a sequence so that a first subset of oscillators can be activated at the same time while a second subset of oscillators are not activated.

13. The transducer array of claim 10, configured to provide an output to an artificial intelligence module.

14. The transducer array of claim 10, wherein the oscillator has a thickness such that the side surface area of the is more than 1% greater than a two-dimensional cross-sectional area of the oscillator.

15. The transducer array of claim 14, wherein the side surface area of the oscillator is at least 1.5 times greater than the two-dimensional cross-sectional area of the oscillator.

16. A method comprising:
providing a monolithic crystal comprising a substrate portion;
providing a first electrode at a first location of the monolithic crystal;
providing a second electrode at a second location of the monolithic crystal;
providing a gap through a thickness of the monolithic crystal to define an oscillator, the gap exposing a side surface of the oscillator, wherein the first location and the second location are locations on the oscillator; and
providing one or more tethers that extend across the gap so that the oscillator is supported by the substrate portion;
wherein the gap is configured to enable an analyte to enter the gap; and
wherein the side surface is functionalized to enable the analyte to accumulate on the side surface of the oscillator.

17. The method of claim 16, wherein providing the gap comprises etching the gap.

18. The method of claim 16, wherein the oscillator has a thickness such that the side surface area of the is more than 1% greater than a two-dimensional cross-sectional area of the oscillator.

19. The method of claim 18, wherein the side surface area of the oscillator is at least 1.5 times greater than the two-dimensional cross-sectional area of the oscillator.

\* \* \* \* \*